(12) United States Patent
Peng et al.

(10) Patent No.: US 8,248,811 B2
(45) Date of Patent: Aug. 21, 2012

(54) SERVER ENCLOSURE AND SERVER ENCLOSURE ASSEMBLY

(75) Inventors: Wen-Tang Peng, Taipei Hsien (TW); Wei Qiu, Shenzhen (TW); Bang-Wei Wang, Shenzhen (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 281 days.

(21) Appl. No.: 12/771,085

(22) Filed: Apr. 30, 2010

(65) Prior Publication Data

US 2011/0227466 A1      Sep. 22, 2011

(30) Foreign Application Priority Data

Mar. 19, 2010   (CN) .......................... 2010 1 0128063

(51) Int. Cl.
*H05K 5/00* (2006.01)

(52) U.S. Cl. .......... 361/756; 361/727; 361/800
(58) Field of Classification Search .......... 361/727, 361/756, 741, 686, 802; 439/377, 374; 312/223.1, 312/223.2
See application file for complete search history.

(56) References Cited

U.S. PATENT DOCUMENTS

| | | | | |
|---|---|---|---|---|
| 4,996,628 A * | 2/1991 | Harvey et al. | ................ | 361/735 |
| 5,156,556 A * | 10/1992 | Ma | ................ | 439/357 |
| 6,320,749 B1 * | 11/2001 | Ayres et al. | ................ | 361/730 |
| 6,520,608 B1 * | 2/2003 | Nelson et al. | ............ | 312/223.1 |
| 6,522,553 B2 * | 2/2003 | Hardin et al. | ................ | 361/756 |
| 6,856,513 B1 * | 2/2005 | Garnett et al. | ................ | 361/725 |
| 7,328,290 B2 * | 2/2008 | Leigh et al. | ................ | 710/104 |

\* cited by examiner

*Primary Examiner* — Hung S Bui
(74) *Attorney, Agent, or Firm* — Altis Law Group, Inc.

(57) ABSTRACT

A server enclosure includes a top plate and a bottom plate. The top plate defines a guiding channel extending along a first direction. The bottom plate parallels to the top plate. The bottom plate protrudes a guiding member. The guiding channel and the guiding member are aligned long a direction perpendicular to the top plate, and the guiding channel is boarder than the guiding member.

15 Claims, 11 Drawing Sheets

SERVER ENCLOSURE AND SERVER ENCLOSURE ASSEMBLY

BACKGROUND

1. Technical Field

The present disclosure relates to enclosures, and more particularly to a server enclosure and server enclosure assembly.

2. Description of Related Art

Typically, there are a large number of servers mounted in a single server rack. Some typical servers are locked and guided by rails on lateral sides of the rack in a manner similar to a removable kitchen drawer. However, the rails occupy much space in this kind of rack. To save space by reducing the number of rails needed, it is possible to stack one server on another server already assembled in the rack. However, it is difficult to secure the stacked server on the flat top surface of the other server.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
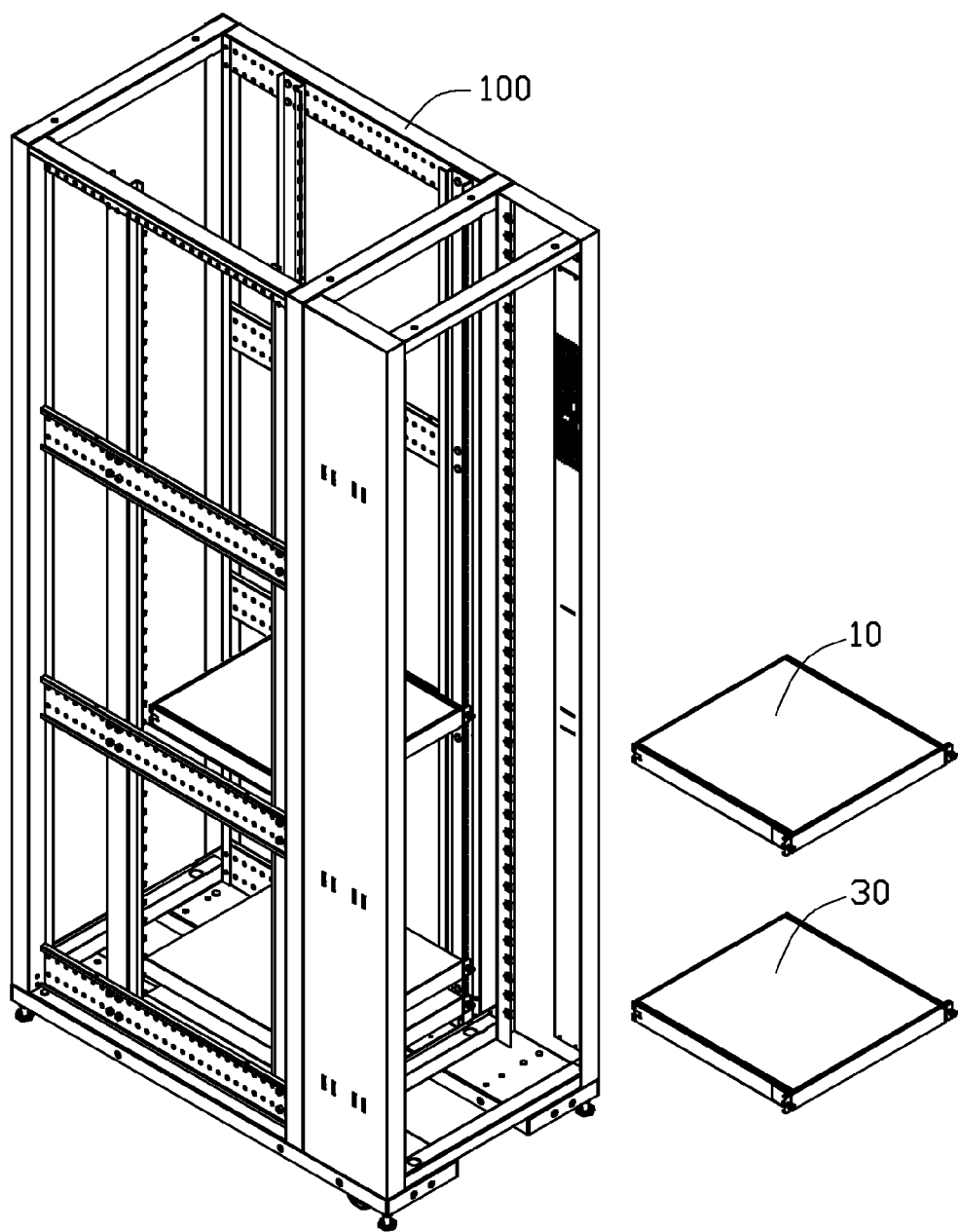
FIG. 1 is an exploded, isometric view of an embodiment of a rack and several server enclosures.
Figure 2:
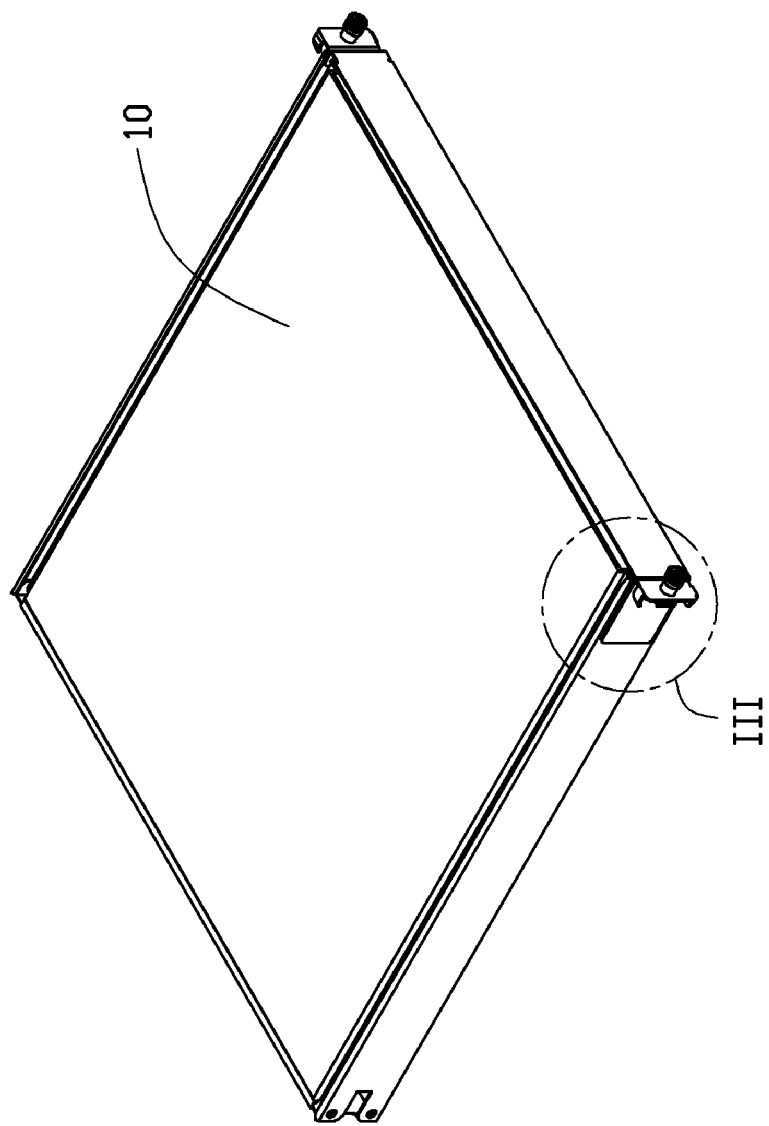
FIG. 2 is an isometric view of a server enclosure of FIG. 1.

Referring to FIG. 1, an embodiment of a plurality of server enclosures installed in a rack 100. The server enclosures include a server enclosure 10 and a server enclosure 30.

Referring through FIG. 2 to FIG. 6, in one embodiment, the server enclosure 10 includes a top plate 12, a bottom plate 16, and two sidewalls 14. The top plate 12 is parallel to the bottom plate 16 and the sidewalls 14 are perpendicular to the top plate 12.

Figure 3:
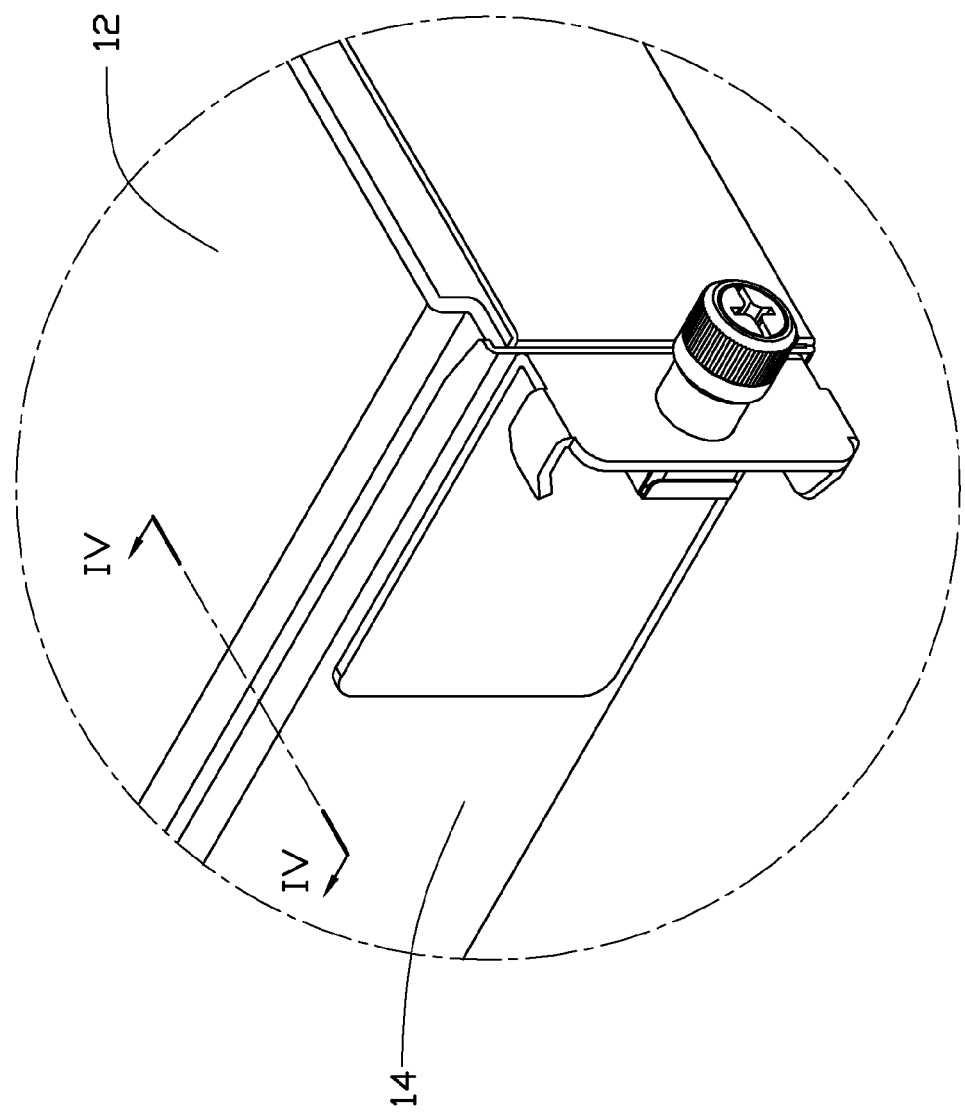
FIG. 3 is an enlarged view of a circled portion III of FIG. 2.
Figure 4:
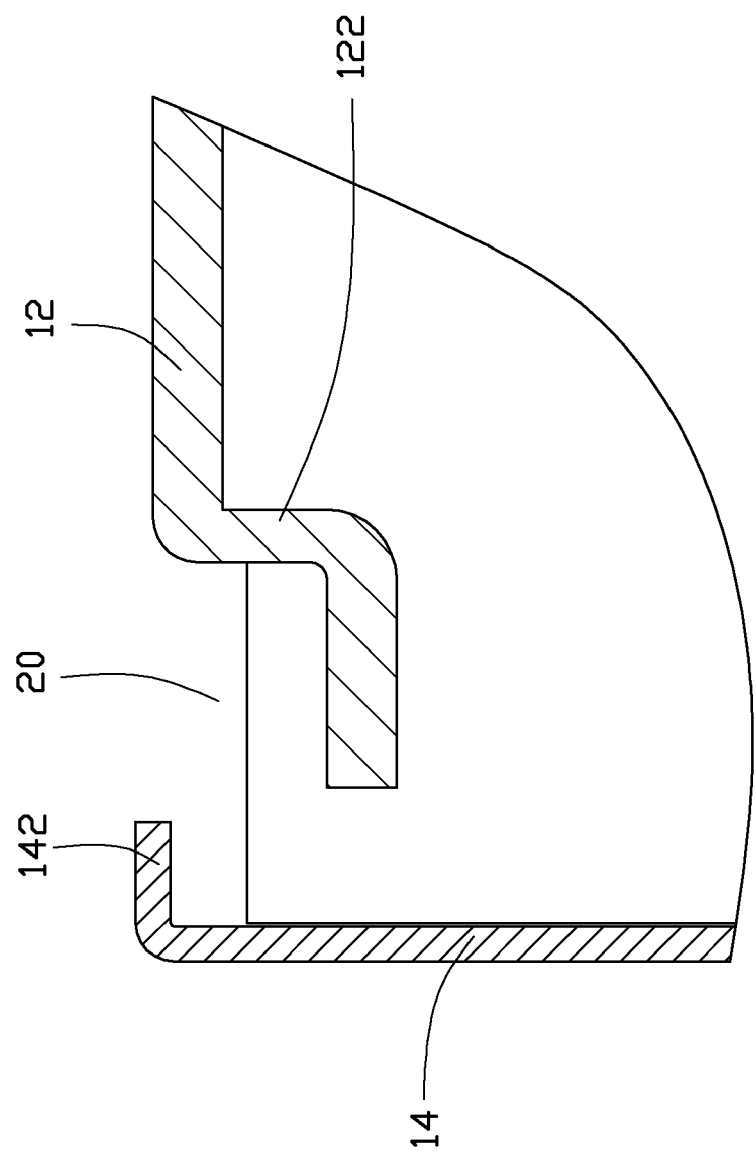
FIG. 4 is sectional view in an enlarged scale taken along line IV-IV of FIG. 3.

Referring to FIG. 3 and FIG. 4, the top plate 12 has a receiving portion 122 at two opposite ends adjacent the sidewalls 14. The receiving portion 122 has an L-shaped cross section. Each sidewall 14 has a stop portion 142. A guiding channel 20 is defined by the receiving portion 122 and the corresponding sidewall 14. The guiding channel 20 extends along a first direction that is parallel to the sidewall 14.

Figure 5:
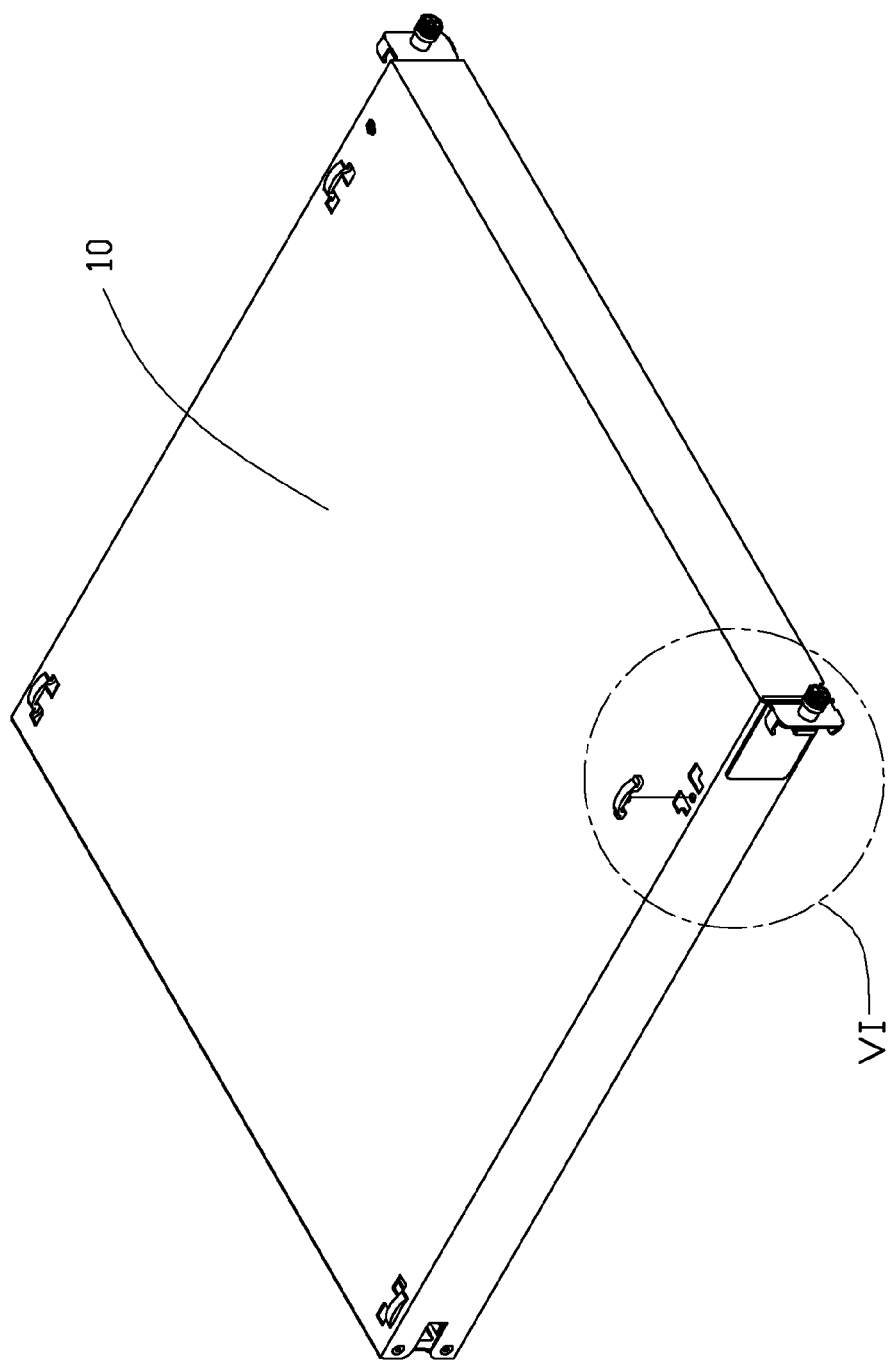
FIG. 5 is similar to FIG. 2, but showing another aspect.
Figure 6:
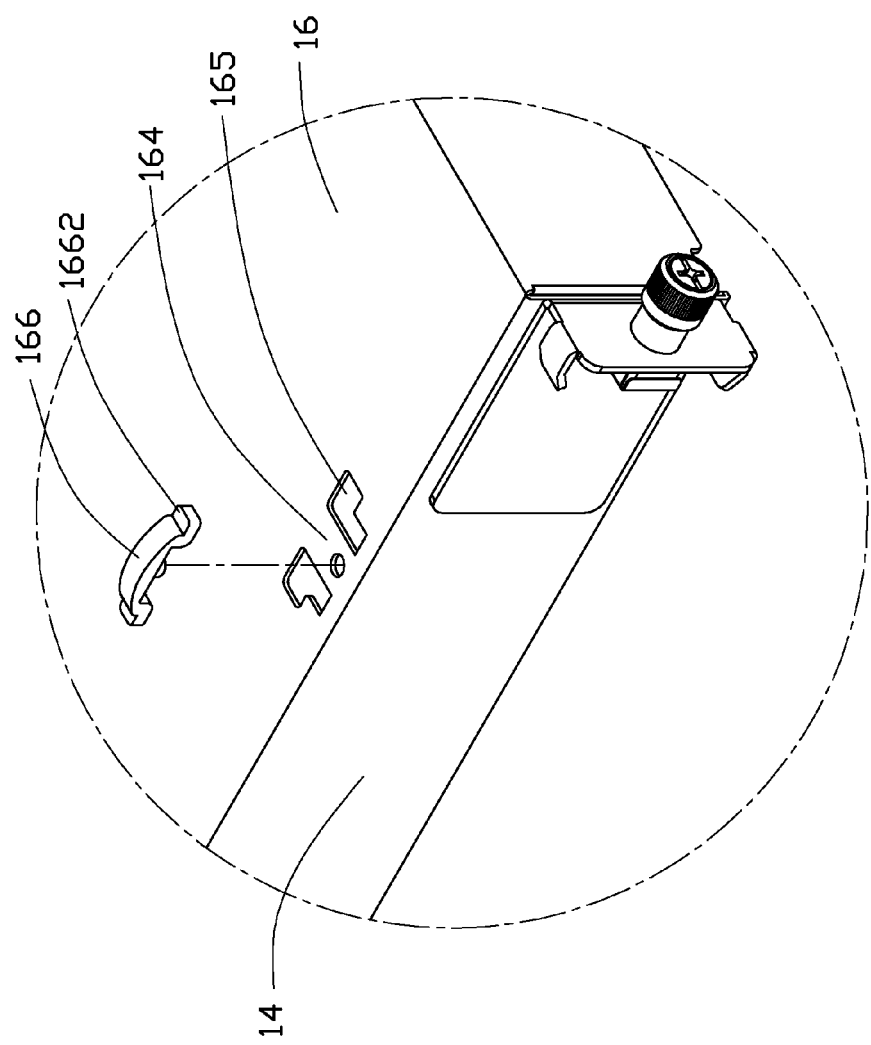
FIG. 6 is an enlarged view of a circled portion VI of FIG. 5.

Referring to FIG. 5 and FIG. 6, the bottom plate 16 defines a pair of L-shaped openings 165 and has a mounting portion 164 between the two openings 165. An arcuate guiding member 166 is mounted to the bottom plate 16. The guiding member 166 has two mounting ends 1662. The guiding member 166 can be mounted to the bottom plate 16 by engagement of the mounting ends 1662 in the corresponding openings 165. The guiding member 166 extends along the first direction. The guiding member 166 is flushed with the guiding channel 20 along an up-to-down direction. The guiding member 166 is narrower than the guiding channel 20.

The server enclosure 30 has similar configuration as the server enclosure 10. When assembling the server enclosure 10 to the rack 100, the server enclosure 30 is first mounted to the rack 100 in a usual manner. The guiding members 166 of the server enclosure 10 are engaged in the corresponding guiding channels 20 of the server enclosure 30. The server enclosure 10 slides along the guiding channels 20 into the rack 100. Thus, the server enclosure 10 is securely stacked on the server enclosure 30 without the need for additional rails for the server enclosure 10.

In other embodiments, locations of the guiding members 166 and the guiding channels 20 of all server enclosures can be alternated.

Figure 7:
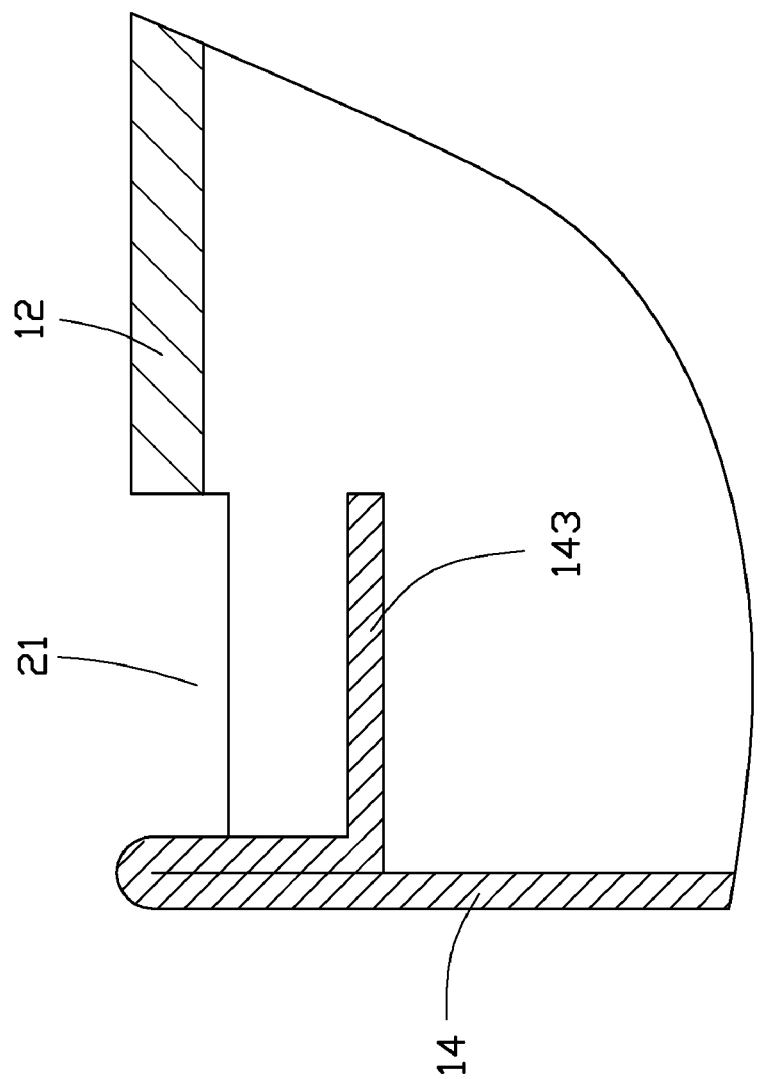
FIG. 7-FIG. 9 are partial sectional views of a guiding channel in other embodiments.
Figure 8:
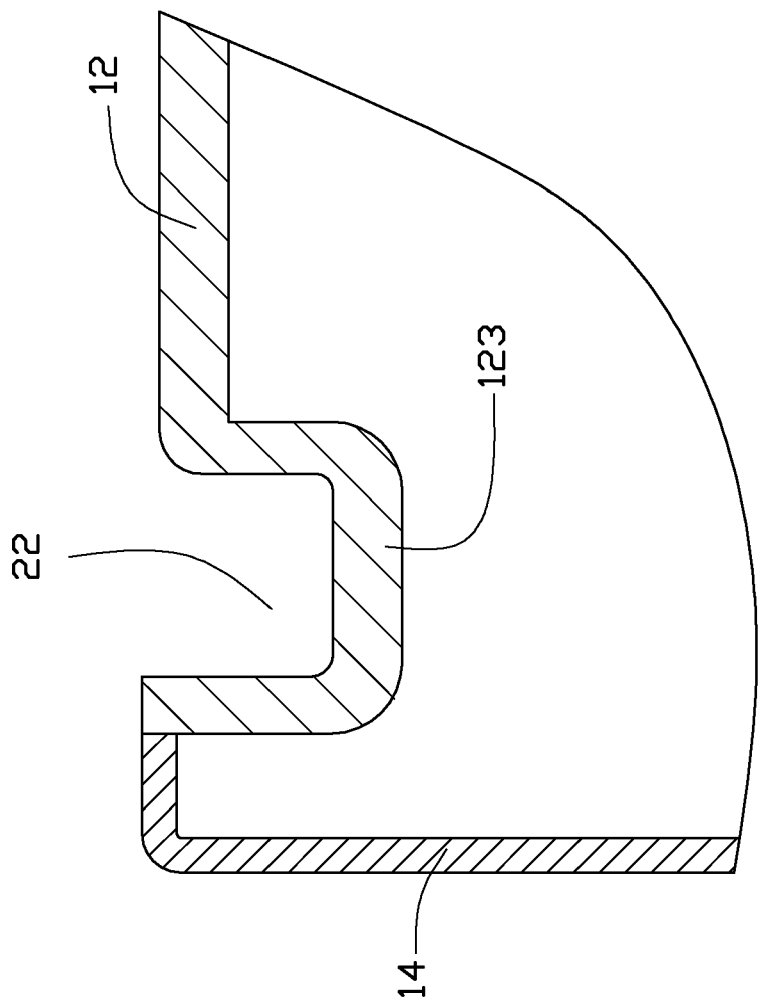
Figure 9:
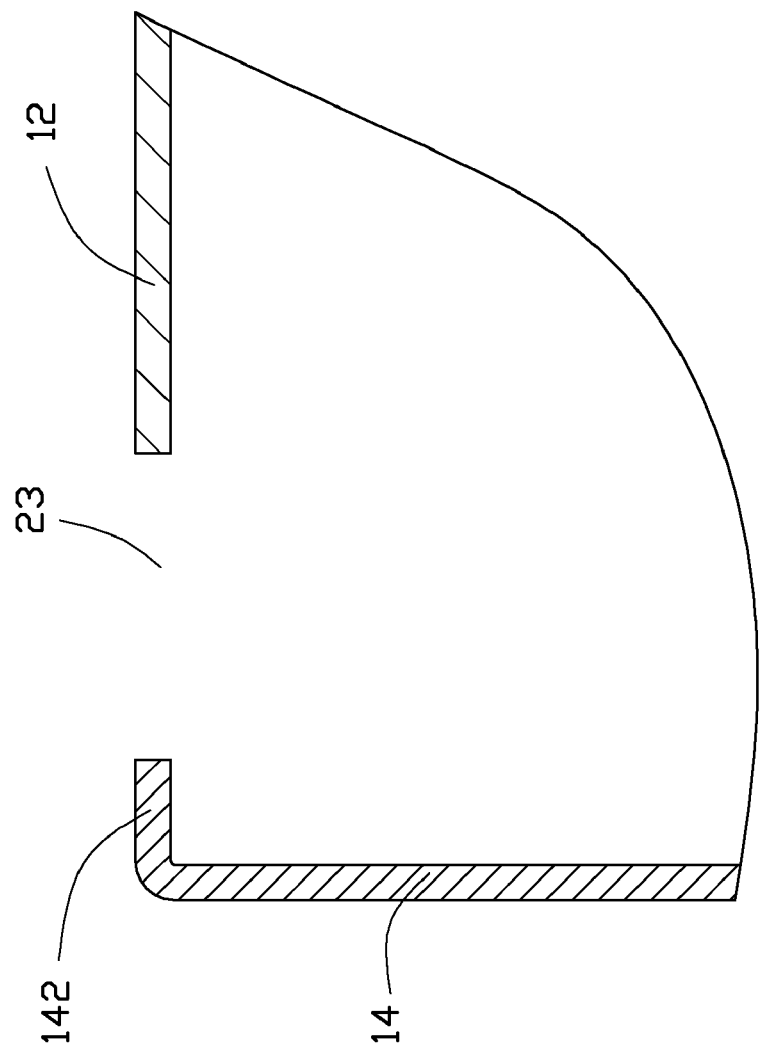

Referring through FIG. 7 to FIG. 9, in other embodiments, some other alternative guiding channels are shown.

Referring to FIG. 7, in another embodiment, a guiding channel 21 can be defined by juxtaposition of an end of the top plate 12 and an L-shaped receiving portion 143 formed on a sidewall 14. The receiving portion 143 is bent back from the sidewall 14.

Referring to FIG. 8, in another embodiment, a guiding channel 22 can be defined by a sidewall 14 and a U-shaped receiving portion 123 formed on the top plate 12.

Referring to FIG. 9, in another embodiment, a guiding channel 23 can be a cutout directly defined by the top plate 12 and the sidewall 14. In this way, the guiding channel 23 can directly receive the guiding member 166 with the top plate 12 supporting a load of the upper server enclosure stacked thereon.

Figure 10:
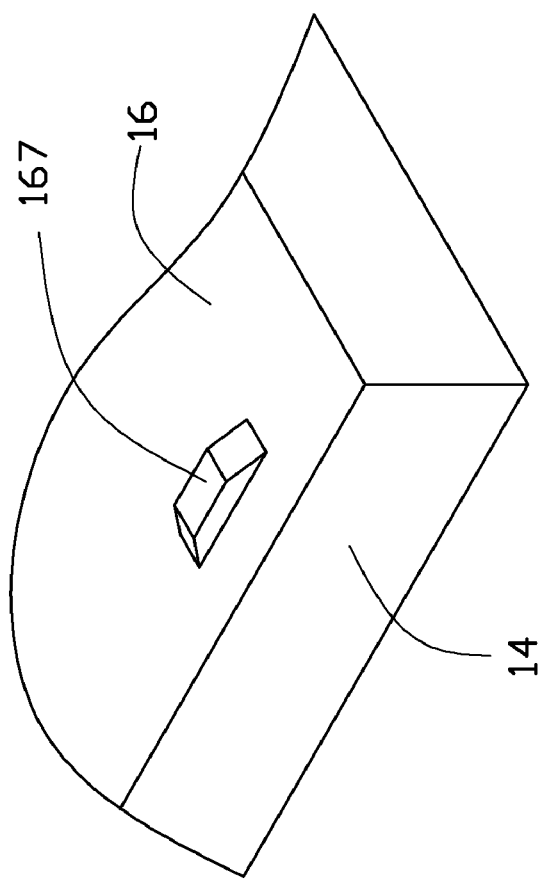
FIG. 10-FIG. 11 are partial views of a guiding member in other embodiments.
Figure 11:
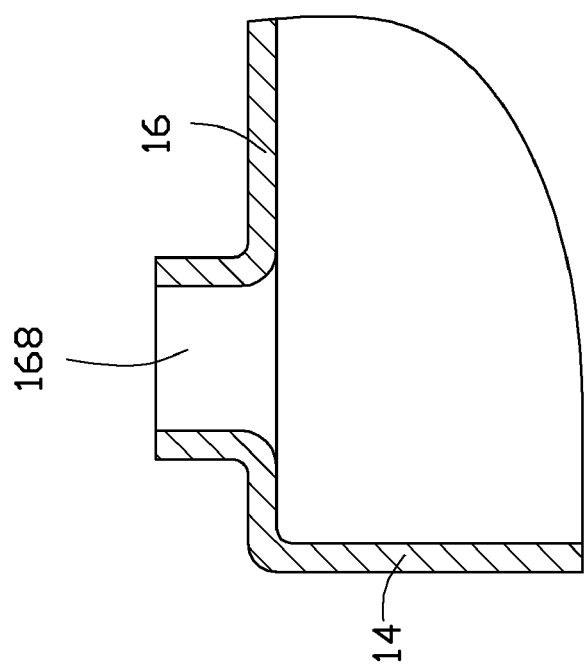

Referring through FIG. 10 to FIG. 11, in other embodiments, some other alternative guiding members are shown.

Referring to FIG. 10, in another embodiment, a guiding member 167 is directly punched from a bottom plate 16 and the guiding member 167 is bridge-shaped.

Referring to FIG. 11, in another embodiment, a guiding member 168 is punched from a bottom plate 16, and the guiding member 168 is a hollow post.

It is also to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A server enclosure comprising:
    a top plate defining a guiding channel extending along a first direction;
    a sidewall perpendicular to the top plate and parallel to the first direction; and
    a bottom plate parallel to the top plate;
    a guiding member being arcuate, the guiding member comprising two mounting ends mounted on the bottom plate;
    wherein the guiding member is detachably mounted to the bottom plate, the guiding channel and the guiding member are aligned along a direction perpendicular to the top plate, and the guiding channel receives the guiding member.

2. The server enclosure of claim 1, wherein the guiding channel has a U-shaped cross section.

3. The server enclosure of claim 1, wherein a receiving portion is located on a distal end of the top plate adjacent the sidewall, the receiving portion has an L-shaped cross section, and the guiding channel is defined by the receiving portion and the sidewall.

4. The server enclosure of claim 1, wherein an L-shaped receiving portion is located on a distal end of the sidewall, and the guiding channel is defined by the L-shaped receiving portion and the top plate.

5. The server enclosure of claim 1, wherein a pair of L-shaped openings is defined in the bottom plate, and each mounting end is engaged with each L-shaped opening for mounting the guiding member.

6. The server enclosure of claim 1, wherein the guiding member is punched from the bottom plate, and the guiding member is bridge-shaped.

7. The server enclosure of claim 1, wherein the guiding member is punched from the bottom plate, and the guiding member is a hollow post.

8. A server enclosure assembly comprising:
a first server enclosure comprising a first bottom plate;
a guiding member detachably mounted to the first bottom plate, and the guiding member being arcuate; and
a second server enclosure comprising a second top plate, the second top plate defining a guiding channel;
wherein the second server enclosure is capable of guiding the first server enclosure to slide thereon with the guiding member engaging with the guiding channel when the first server enclosure is stacked on the second sever enclosure.

9. The server enclosure assembly of claim 8, wherein the guiding channel has a U-shaped cross section.

10. The server enclosure assembly of claim 8, wherein the second server enclosure further comprises a second sidewall perpendicular to the second top plate.

11. The server enclosure assembly of claim 10, wherein an L-shaped receiving portion is formed on a distal end of the second top plate adjacent the second sidewall, and the guiding channel is defined by the L-shaped receiving portion and the second sidewall.

12. The server enclosure assembly of claim 10, wherein a receiving portion is formed on a distal end of the second sidewall, the receiving portion has an L-shaped cross section, and the guiding channel is defined by the receiving portion and the second top plate.

13. The server enclosure assembly of claim 8, wherein the guiding member comprises two mounting ends, a pair of L-shaped openings is defined in the first bottom plate, and each mounting end is engaged with each L-shaped opening for mounting the guiding member.

14. The server enclosure assembly of claim 8, wherein the guiding member is punched from the first bottom plate, and the guiding member is bridge-shaped.

15. The server enclosure assembly of claim 8, wherein the guiding member is punched from the first bottom plate, and the guiding member is a hollow post.

\* \* \* \* \*